United States Patent [19]

Majumdar et al.

[11] Patent Number: 5,055,721
[45] Date of Patent: Oct. 8, 1991

[54] DRIVE CIRCUIT FOR IGBT DEVICE

[75] Inventors: Gourab Majumdar; Shigekazu Yoshida, both of Itami, Japan

[73] Assignee: Mitsubishi Denki Kabushiki Kaisha, Tokyo, Japan

[21] Appl. No.: 422,685

[22] Filed: Oct. 17, 1989

[30] Foreign Application Priority Data

Apr. 13, 1989 [JP] Japan .................................. 1-93711

[51] Int. Cl.$^5$ ...................... H03K 17/08; H03K 17/28
[52] U.S. Cl. .................................. 307/570; 307/270; 307/592; 307/546; 361/86; 361/101
[58] Field of Search ............ 307/270, 570, 264, 546, 307/547, 548, 592; 361/56, 57, 91, 100, 101, 86, 87

[56] References Cited

U.S. PATENT DOCUMENTS

| | | | |
|---|---|---|---|
| 4,301,490 | 11/1981 | Nagel et al. | 361/100 |
| 4,591,734 | 5/1986 | Laughton | 307/270 |
| 4,612,457 | 9/1986 | Prater | 307/270 |
| 4,721,869 | 1/1988 | Okada | 307/270 |

FOREIGN PATENT DOCUMENTS 63-95722 4/1988 Japan .

Primary Examiner—Timothy P. Callahan
Attorney, Agent, or Firm—Oblon, Spivak, McClelland, Maier & Neustadt

[57] ABSTRACT

A MOS transistor ($Q_M$) detects an increase of the collector current ($I_C$) of an IGBT device ($Q_O$). When an excess current passes, the transistor ($Q_M$) turns on, which restricts the gate voltage ($V_G$) of the IGBT device ($Q_O$) to decrease the collector current ($I_C$). This protects the IGBT device ($Q_O$) from the excess current. A Zener diode ($D_Z$) placed on a path which is for detecting the excess current of the IGBT device ($Q_O$) restricts the current passing through the path. This decreases reactive power which is consumed in protecting the device ($Q_O$) from the excess current while protecting a drive circuit from an erroneous operation.

13 Claims, 6 Drawing Sheets

DRIVE CIRCUIT FOR IGBT DEVICE

BACKGROUND OF THE INVENTION

1. Field of the Invention

The present invention relates to a drive circuit for driving an IGBT (Insulated Gate Bipolar Transistor) device which is a semiconductor switching device and, more particularly, to the protection of an IGBT from an excess current.

2. Description of the Background Art

An IGBT device is characterized by high breakdown voltage and large current capacity similar to a bipolar transistor. Further, similar to a power MOSFET, the IGBT device has a high input impedance due to its insulation gate structure, so that it is also characterized by easiness in driving and rapid switching possibility. Hence, the IGBT device has recently attracted attention as a new device having such characteristics. Devices named IGT, COMFET, GEMFET, MBT or BiFET are commercially available.

Figure 1A:
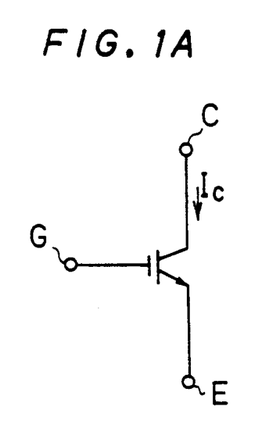
FIG. 1A ia a diagram showing a symbol of an IGBT device.
Figure 1B:
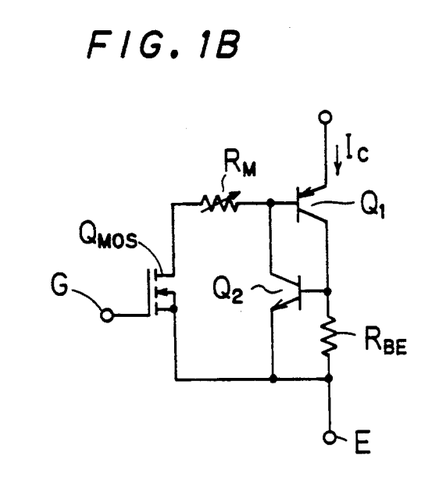
FIG. 1B is a diagram showing an equivalent circuit of the IGBT device.

FIG. 1A is a diagram showing a symbol of an IGBT device, including a gate G, a collector C and an emitter E. FIG. 1B is a circuit diagram showing an equivalent circuit of the IGBT device. Referring to FIG. 1B, the IGBT device has its gate G connected to a gate of a MOS transistor $Q_{MOS}$ and its emitter E connected to a source of the MOS transistor $Q_{MOS}$. A pnp transistor $Q_1$ and an npn transistor $Q_2$ which make up a thyristor are inserted between the collector C and the emitter E. The transistor $Q_1$ has its emitter connected to the collector C of the IGBT device and its base connected to a collector of the transistor $Q_2$ and its collector connected to a base of the transistor $Q_2$. The transistor $Q_2$ has its collector connected to a drain of the MOS transistor $Q_{MOS}$ through a modulation resistance $R_M$ and its emitter connected to the emitter E of the IGBT device. A resistance $R_{BE}$ is connected between the base and emitter of the transistor $Q_2$. A collector current $I_C$ is shown in FIGS. 1A and 1B.

Now, protecting the IGBT device from an excess current will be described. When the collector current $I_C$ rises to be above a predetermined value, a parasitic thyristor composed of the transistors $Q_1$, $Q_2$ turns on. Once current begins to flow in response to this turn on, this current can not be broken and generates heat which destructs the IGBT device. This phenomenon is called latch-up, and the current value is referred to as a latch-up current. Sufficient care must be taken in using the IGBT device with regard to the above problems.

For protecting the IGBT device from an excess current, it is important to restrain an excess current below the latch-up current in the IGBT device. The collector current $I_C$ of the IGBT device depends upon a gate voltage. If the gate voltage is above a predetermined value, the collector current would rise above the latch-up current to cause the latch-up.

Figure 2:
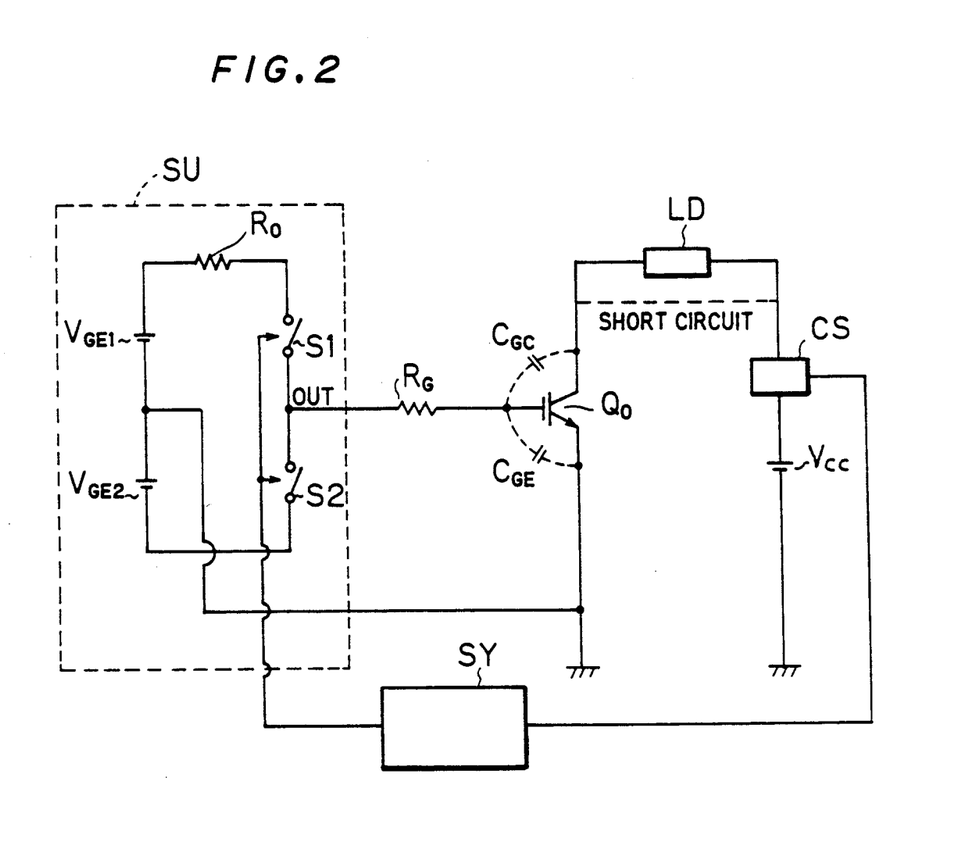
FIG. 2 is a circuit diagram of a conventional drive circuit of an IGBT device.

FIG. 2 is a circuit diagram showing a conventional drive circuit for the IGBT device. A switching unit SU is provided with voltage sources $V_{GE1}$ and $V_{GE2}$. A negative potential terminal of the voltage source $V_{GE1}$ and a positive potential terminal of the voltage source $V_{GE2}$ are grounded. The positive potential terminal of the voltage source $V_{GE1}$ is connected to an output point OUT via an output resistance $R_O$ and a switching element $S_1$. The negative potential terminal of the voltage source $V_{GE2}$ is connected to the output point OUT via a switching element $S_2$.

The output point OUT is connected to a gate of an IGBT device $Q_O$ via a gate resistance $R_G$. The IGBT device $Q_O$ has its emitter grounded and its collector connected to a positive potential terminal of supply voltage $V_{CC}$ via a load LD and a current sensor CS. A negative potential terminal of the supply voltage $V_{CC}$ is grounded. Capacities $C_{GC}$ and $C_{GE}$ exist between the gate and collector and between the gate and emitter as a parasitic capacity, respectively.

An output of the current sensor CS is applied to a control system. When the current sensor CS senses an excess current, the control system SY performs its protecting operation to turn off the switching element $S_1$ and to turn on the switching element $S_2$, whereby the IGBT device $Q_O$ is forced to be in the OFF condition.

Now, an operation of the above prior art will be described. A control signal form the control system SY decides the ON/OFF condition of the switching elements $S_1$, $S_2$. When the switching element $S_1$ is in the ON condition, and the switching element $S_2$ is in the OFF condition, the IGBT device $Q_O$ turns on to supply current to the load LD. When the switching element $S_1$ is in the OFF condition, and the switching element $S_2$ is in the ON condition, the IGBT device $Q_O$ turns off not to supply current to the load LD. Thus, the current supplied to the load LD is controlled by controlling the ON/OFF condition of the switching elements $S_1$, $S_2$.

An abnormal operation with regard to the prior art will now be described. When a motor, for example, is employed as the load LD, the supply voltage $V_{CC}$ could be directly applied to the collector of the IGBT device $Q_O$ due to an abnormal operation of the motor, as shown by a dotted line in FIG. 2. Since a voltage of several hundreds volt is used as the supply voltage $V_{CC}$, the collector current $I_C$ is so rapidly increased as to cause the IGBT device $Q_O$ to generate heat. The collector current $I_C$ is further increased as the temperature of the IGBT device $Q_O$ goes up, so that the parasitic thyristor composed of the transistors $Q_1$, $Q_2$ shown in FIG. 2B can easily turn on. As a result, when the load becomes short circuited, latching-up due to a heat generation is liable to occur before the above-mentioned protection operation is completed by the control system SY.

Further, when the load is short-circuited, high voltage from the supply voltage $V_{CC}$ is instantaneously applied across the collector and emitter. At this time, the gate voltage is instantaneously increased because the capacities $C_{GC}$, $C_{GE}$ exist. The increased voltage $\Delta V_{GE}$ is given by the following equation with an increased voltage $\Delta V_{CE}$ applied across the collector and emitter in step manner:

$$\Delta V_{GE} = \Delta V_{CE} \times C_{GC}/C_{GE} \qquad (1)$$

The increased voltage $\Delta V_{CE}$ ranges approximately from tens of volts to hundreds of volts, and the capacity ratio $C_{GC}/C_{GE}$ is approximately 0.01–0.05. For example, providing $\Delta V_{CE} = 100$ V and $C_{GC}/C_{GE} = 0.05$, $\Delta V_{GE} = 5$ V in accordance with the equation (1). In the case, the gate voltage is increased by 5 V compared with the gate voltage at the normal operation, so that the collector current $I_C$ increases and latching-up may instantaneously occur.

Reducing a value of the gate resistance $R_G$ relieves the latch-up due to the voltage increase of the capacitive component to some extent. However, when the gate resistance $R_G$ is reduced too much, a variation $dV/dt$ becomes large on switching to the voltage source $V_{GE2}$, so that the IGBT device $Q_O$ is liable to be latched up. Accordingly, tens of ohms to hundreds of ohms of resistance is required for the gate resistance $R_G$. It is generally known that when the resistance is increased too much, a switching time becomes long and power loss at the time of switching is increased, so that switching at a high frequency becomes difficult.

In the conventional drive circuit, in order to avoid a latch-up as described above, the gate voltage in the normal operation is reduced by using a low voltage for the voltage source $V_{GE1}$. In this way, the amount of a normal collector current $I_C$ is kept small in the IGBT device $Q_O$, and therefore latch-up does not occur even if the collector current $I_C$ is increased by the short-circuited load. However, increase in ON state resistance of the IGBT device $Q_O$ aggravates power loss in circuit elements other than the load LD.

A drive circuit for a conventional IGBT device structured as has been described drives the IGBT device $Q_O$ with the relatively low gate voltage not to latch-up the IGBT device $Q_O$. Therefore, such a drive circuit has disadvantages that the ON state resistance of the IGBT devices $Q_O$ is high, and significant power loss is caused in the IGBT device $Q_O$.

SUMMARY OF THE INVENTION

A circuit in accordance with the present invention for driving an insulated gate bipolar transistor connected to a load to supply a current to the load comprises a forward gate bias power source for applying a forward gate bias voltage to a gate of the insulated gate bipolar transistor to drive the insulated gate bipolar transistor; A voltage lowering means is also connected to a collector of the insulated gate bipolar transistor for lowering a voltage of the collector by a predetermined potential; Further, a voltage divider is connected between the voltage lowering means and an emitter of the insulated gate bipolar transistor, which has an intermediate point for providing a divided voltage, and a current path is disposed between the gate of the insulated gate bipolar transistor and a terminal havinag a predetermined voltage; Also, a MOS transistor having a gate connected with the intermediate point of the divider and a source and drain is serially disposed in the current path, and an output resistor is connected between the gate of the insulated gate bipolar transistor and the forward gate bias power source.

According to the present invention, there is provided a MOS transistor which has its gate connected to an intermediate point of a voltage divider and its source and drain disposed in series in a current path provided between a gate of an insulated gate bipolar transistor and an terminal providing a predetermined potential, whereby the MOS transistor becomes conductive when a potential at a collector of the insulated gate bipolar transistor is above a predetermined potential to limit a gate potential of the insulated gate bipolar transistor.

Accordingly, it is an object of the present invention to provide a drive circuit for an IGBT device which inhibits a latch-up of the IGBT device while being capable of reducing power loss by making the gate voltage sufficiently high to make the ON state resistance of the IGBT device small.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 3:
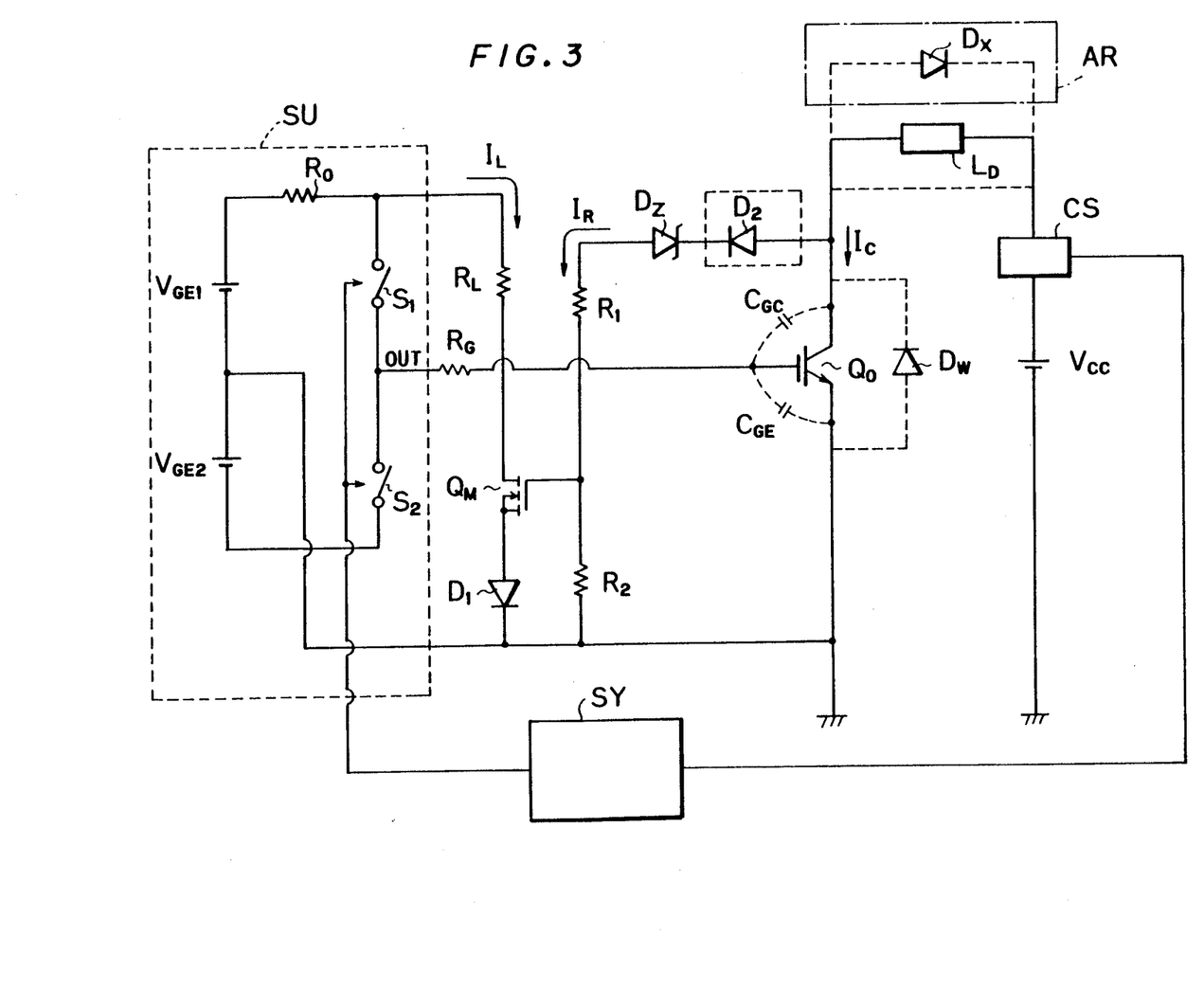
FIG. 3 is a circuit diagram of a drive circuit of the IGBT device of an embodiment according to the present invention.

An embodiment according to the present invention will be described in conjunction with the accompanying drawings. FIG. 3 is a circuit diagram of a drive circuit of an IGBT device according to an embodiment of the present invention.

A switching unit SU is provided with voltage sources $V_{GE1}$, $V_{GE2}$. A negative potential terminal of the voltage source $V_{GE1}$ and a positive potential terminal of the voltage source $V_{GE2}$ are grounded. The positive potential terminal of the voltage source $V_{GE1}$ is connected to an output point OUT via an output resistance $R_O$ and a switching element $S_1$, and the negative potential terminal of the voltage source $V_{GE2}$ is connected to the output point OUT via a switching element $S_2$. In response to a control signal from the control system SY, the ON/OFF condition of the switching elements $S_1$, $S_2$ is designated.

The output point OUT is connected to a gate of an IGBT device $Q_O$ via a gate resistance $R_G$. The IGBT device $Q_O$ has its emitter grounded and its collector connected to a positive potential terminal of supply voltage $V_{CC}$ via a load LD and a current sensor CS. A negative potential terminal of the supply voltage $V_{CC}$ is grounded. Further, capacities $C_{GC}$ and $C_{GE}$ exist between the gate and collector and between the gate and emitter as a parasitic capacity, respectively.

An output of the current sensor CS is applied to a control system SY. When the current sensor CS senses an excess current, the control system SY practices its protecting operation to cause the switching element $S_1$ to be in the OFF condition and the switching element $S_2$ to be in the ON condition so as to force the IGBT device $Q_O$ to be in the OFF condition.

A junction of the output resistance $R_O$ and the switching element $S_1$ is connected to a drain of a MOS transistor $Q_M$ via a resistance $R_L$. A source of the MOS transistor $Q_M$ is connected to an anode of an diode $D_1$, and a cathode of the diode $D_1$ is connected to ground potential. A current $I_L$ flows along the path in a direction shown in the figure. The diode $D_1$ serves to prevent the current $I_L$ from flowing reversely. The resistance $R_L$ serves to limit the value of the current $I_L$.

The collector of the IGBT device $Q_O$ is connected to an anode of a diode $D_2$, and a cathode of the diode $D_2$ is connected to a cathode of a Zener diode $D_Z$. An anode of the Zener diode $D_Z$ is grounded via resistances $R_1$ and $R_2$ serving as a potential divider. A current $I_R$ flows along the path in a direction shown in the figure. The diode $D_2$ serves to prevent the current $I_R$ from reversely flowing and is not essential. A junction of the resistance $R_1$ and the resistance $R_2$ is connected to a gate of the MOS transistor $Q_M$.

A flywheel diode $D_W$ is incorporated between the collector and the emitter of the IGBT device $Q_O$, usually in anti-parallel thereto. The flywheel diode $D_W$ has its anode connected to the emitter of the IGBT device $Q_O$ and its cathode connected to the collector. As can be seen, a collector current $I_C$ flows from the collector to the emitter in the IGBT device $Q_O$.

Usually, the whole drive circuit is structured as a bridge circuit consisting of a plurality of arms. The drive circuit shown in FIG. 3 corresponds to one of those arms, and other arms have similar construction. Wiring between the arms is so provided that a flywheel diode $D_X$ in another arm AR is connected to the opposite ends of the load $L_D$ in anti-parallel thereto.

Figure 4:
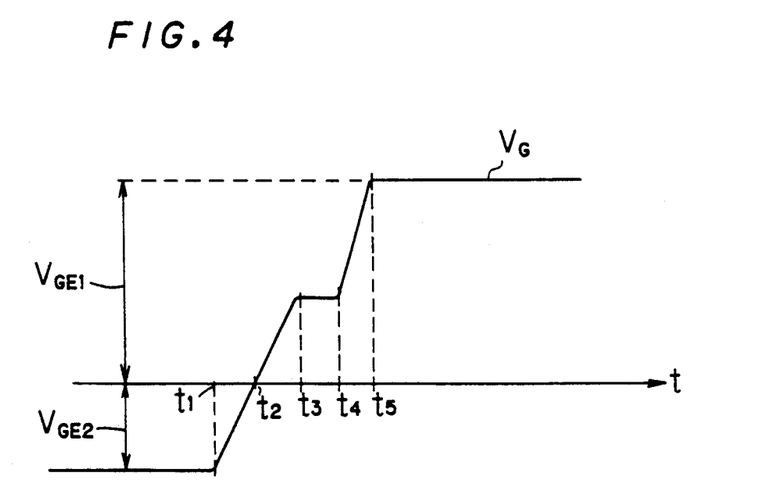
FIG. 4 is a timing chart illustrating a waveform of the gate voltage at the normal operation of the circuit shown in FIG. 3.
Figure 5:
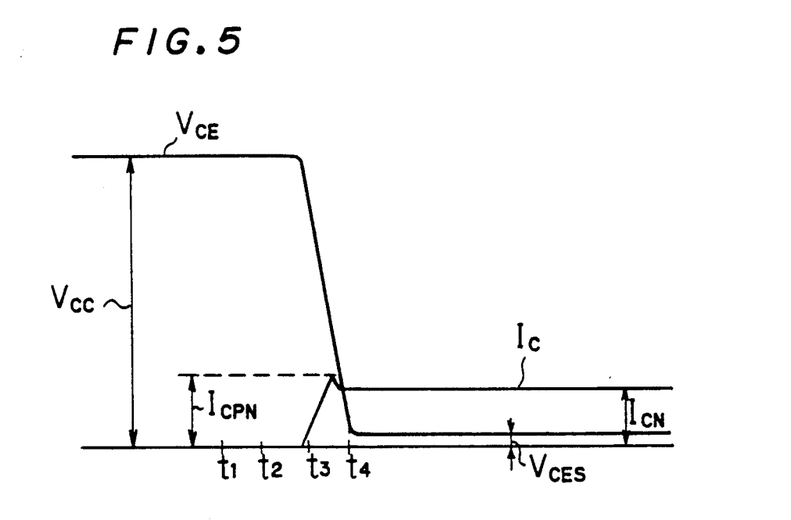
FIG. 5 is a timing chart illustrating waveforms of a collector-emitter voltage and a collector current at the normal operation of the circuit shown in FIG. 3.

An operation of the drive circuit will now be described. FIGS. 4 and 5 are timing charts illustrating waveforms of each element of the drive circuit shown in FIG. 3 in its normal operation.

At time $t < t_1$, the switching element $S_1$ of FIG. 3 is in the OFF condition and the switching element $S_2$ is in the ON condition. In the normal operation, the switching elements $S_1$ and $S_2$ are alternately switched ON/OFF and, in response to this, the IGBT device $Q_O$ is switched at a predetermined frequency. The negative potential terminal of the voltage source $V_{GE2}$ is connected to the gate of the IGBT device $Q_O$ via the switching element $S_2$ and the gate resistance $R_G$. Referring to FIG. 4, during the period, a negative voltage ($-V_{GE2}$) is applied to cause the IGBT device $Q_O$ to turn off. Referring to FIG. 5, no collector current $I_C$ flows, and supply voltage $V_{CC}$ is applied as a collector-emitter voltage $V_{CE}$.

Further, since a very large supply voltage $V_{CC}$ is applied to a path composed of the diodes $D_2$ and $D_Z$ and the resistance $R_1$ and $R_2$, a constant value of current $I_R$ flows. The current $I_R$ is involved in the protection operation described later but not involved in the normal drive operation. Therefore, the current $I_R$ is a reactive current for a period when the IGBT device $Q_O$ is in the OFF condition. Setting of a constant of each element for reducing the reactive current will be explained later.

At time $t_1$, the switching element $S_1$ is in the ON condition and the switching element $S_2$ is in the OFF condition. The positive potential terminal of the voltage source $V_{GE1}$ is connected to the gate of the IGBT device $Q_O$ via the resistance $R_O$, the switching element $S_1$ and the gate resistance $R_G$. As shown in FIG. 4, the gate voltage $V_G$ goes up and reaches 0V at time $t_2$. Further, the gate voltage $V_G$ reaches a potential at which the IGBT device $Q_O$ becomes active, before time $t_3$. In accordance with the rise of the gate voltage $V_G$, the collector current $I_C$ begins to flow before time $t_3$. On the other hand, voltage $V_{CE}$ begins to go down since the IGBT device $Q_O$ turns from the OFF condition to the ON condition.

In general, a phenomenon that the gate voltage is kept at a constant level appears in the initial stage of the ON condition in accordance with a known characteristic of the IGBT device. Thus, after the IGBT device $Q_O$ turns on, the gate voltage $V_G$ is kept at a certain voltage until time $t_4$, and thereafter it further goes up. At time $t_5$, the gate voltage $V_G$ reaches the voltage completely equal to that of the positive potential terminal of the voltage source $V_{GE1}$.

The collector current $I_C$ is temporarily increased from time $t_3$ to time $t_4$ because of a reverse recovery current of the flywheel diode $D_X$ in the arm AR to reach a normal peak current $I_{CPN}$. After that, it comes into a stationary state to reach a normal current value $I_{CN}$ determined depending upon the voltage source $V_{GE1}$. In accordance with the ON transition of the IGBT device $Q_O$, the voltage $V_{CE}$ goes down from time $t_3$ to time $t_4$. After time $t_4$, it reaches a saturation voltage $V_{CES}$ since the IGBT device $Q_O$ reaches the complete ON condition.

Figure 6:
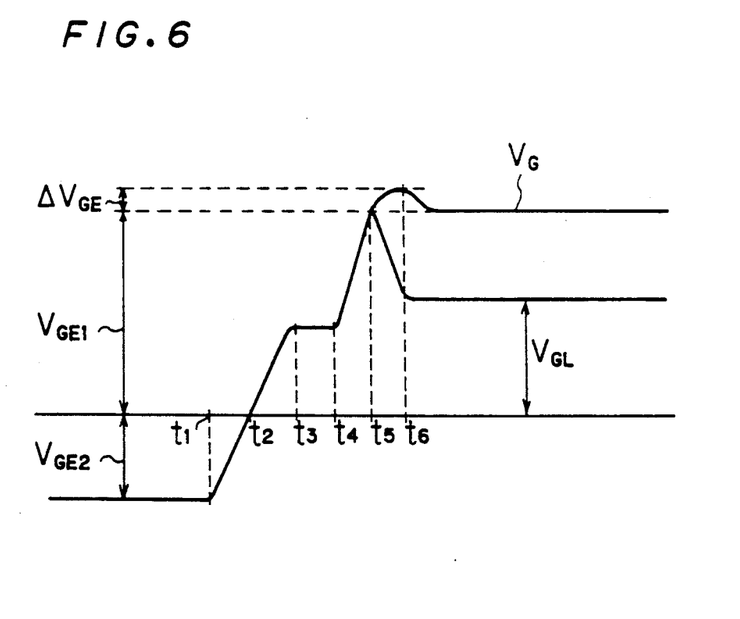
FIG. 6 is a timing chart illustrating a waveform of a gate voltage of the circuit shown in FIG. 3 in the case of the short-circuit of a load.
Figure 7:
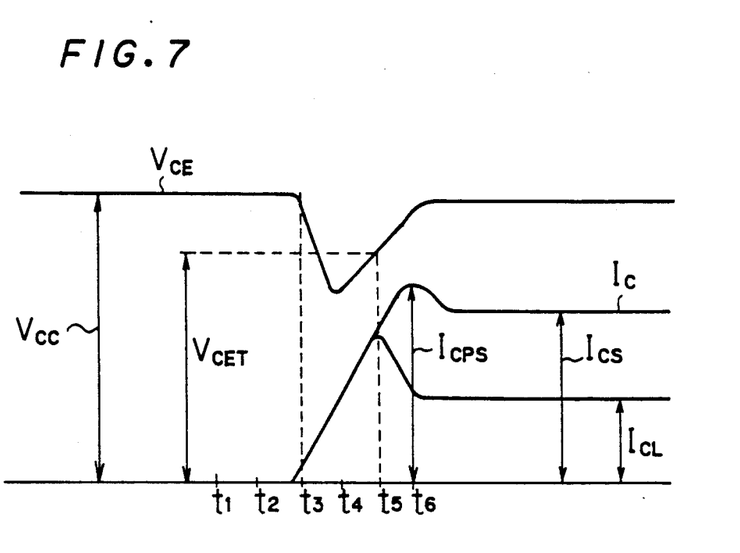
FIG. 7 is a timing chart illustrating waveforms of a collector-emitter voltage and a collector current of the circuit shown in FIG. 3 in the case of the short-circuit of a load.

FIGS. 6 and 7 are timing charts illustrating waveforms of each part of the drive circuit in the case of the short-circuit of the load.

For contrast to the protection operation explained later, the operation of the conventional drive circuit shown in FIG. 2 in the case of the short-circuit of the load will now be described. This conventional drive circuit is equivalent to a circuit in which a protection circuit consisting of the diodes $D_1$, $D_2$ and $D_Z$, the resistances $R_1$, $R_2$ and $R_L$ and the MOS transistor $Q_M$ is eliminated unlike the circuit of FIG. 3 and, therefore, has no protection function.

Assume that the load LD is short-circuited before time $t_3$. Referring to FIG. 6, a waveform of the gate voltage $V_G$ in the case of the short-circuit of the load is identical with that of the gate voltage $V_G$ in the normal operation explained hereinbefore with reference to FIG. 4, in accordance with the ON/OFF condition of the switching elements S1 and S2 before time $t_5$.

After time $t_5$, since the supply voltage $V_{CC}$ is directly applied to the collector because of the short-circuited load $L_D$, the gate voltage $V_G$ transiently goes up by a voltage increase $\Delta V_{GE}$ in proportion to the capacity ratio $C_{GC}/C_{GE}$ until time $t_6$. After that, the gate voltage $V_G$ goes down to the voltage of the positive potential terminal of the voltage source $V_{GE1}$ to be in a stationary state.

Referring to FIG. 7, the collector current $I_C$ begins to flow before time $t_3$ in accordance with the rise of the gate voltage $V_G$, and thereafter it is increased. It is temporarily increased in accordance with the increased amount of the voltage $\Delta V_{GE}$ and reaches the peak current $I_{CPS}$ in the case of the short-circuit of the load at time $t_6$. It comes to a stationary state thereafter to reach a constant current value $I_{CS}$ in the case of the short-circuit of the load.

For a period from time $t_3$ to time $t_4$ where the IGBT device $Q_O$ is transfered to the complete ON condition, the collector-emitter voltage $V_{CE}$ temporarily goes down from the supply voltage $V_{CC}$ because a small collector current $I_C$ flows and the collector-emitter resistance of the IGBT device $Q_O$ is also small. After that, as the collector current $I_C$ is increased, the collector-emitter resistance of the IGBT device $Q_O$ becomes large. Further, because the load $L_D$ is short-circuited, the collector-emitter voltage $V_{CE}$ goes up to the supply voltage $V_{CC}$ and almost reaches the supply voltage $V_{CC}$ in the statinary state after time $t_6$.

In the stationary state after time $t_6$, the collector-emitter voltage $V_{CE}$ is maintained almost at the supply voltage $V_{CC}$, and hence the current value $I_{CS}$ in the case of the short-circuit of the load is much larger than the normal current value $I_{CN}$ mentioned above with reference to FIG. 5, approximately 6 to 7 times, for example, as large as the rated current flowing in the normal operation.

In the above stated drive circuit without a protection function, latch-up may be instantaneously caused in the IGBT device $Q_O$ because of the temporarily increased peak current $I_{CPS}$ in the case of the short-circuit of the load.

Additionally, even if latch-up is not caused in the IGBT device $Q_O$ due to the peak current $I_{CPS}$ in the case of the short-circuit of the load, latch-up may be caused by current increase due to a heat generation as explained below.

As has been described, such a drive circuit is usually protected by the control system SY for controlling the switching elements $S_1$, $S_2$. Usually, however, it takes approximately 30 μsec for the current sensor CS to sense an excess current caused by an abnormal operation such as short-circuiting of the load and for the control system SY to make the switching element $S_1$ be in the OFF condition and the switching element $S_2$ be in the ON condition so as to force the IGBT device $Q_O$ to turn off. When the load is short-circuited, the collector current $I_C$ having a current value $I_{CS}$ which is 6 to 7 times as large as the rated current flows even in the stationary state after $t_6$, and therefore latch-up is caused by a heat generation in approximately 5–30 μsec. Consequently, the protection operation by the control system SY becomes unavailable.

Now, an operation of the drive circuit shown in FIG. 3 having a protection function will be described.

Figure 8:
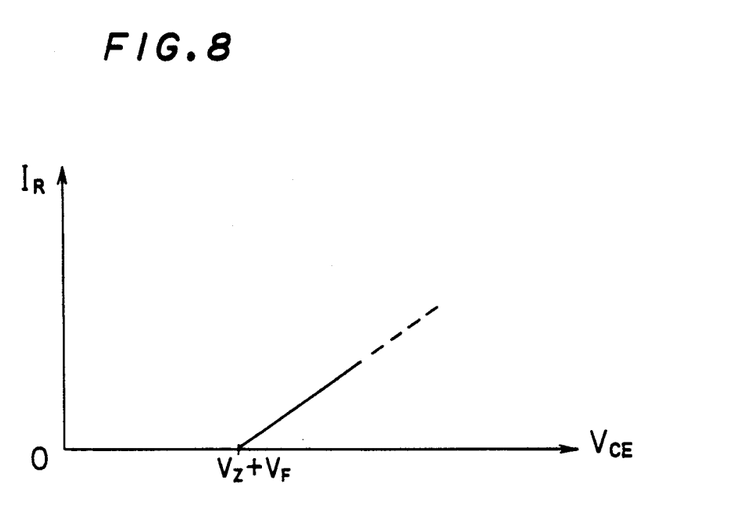
FIG. 8 is a graph illustrating a relationship between the collector-emitter voltage and a current $I_R$.

The operation before time $t_4$ is the same as that of the above-mentioned circuit without protection function. After time $t_4$, the collector-emitter voltage $V_{CE}$ of the IGBT device $Q_O$ is increased. When the collector-emitter voltage $V_{CE}$ is larger than the sum of Zener voltage $V_Z$ of the Zener diode $D_Z$ and a forward voltage $V_F$ of the diode $D_2$, the current $I_R$ flows in accordance with a characteristic shown in FIG. 8. The V−I characteristic assumes monotonic increase although it depends upon the characteristics of the diodes $D_2$ and $D_Z$, and the current $I_R$ is increased in accordance with a increase in the voltage $V_{CE}$.

The gate voltage of the MOS transistor $Q_M$ is given by $I_R \times R_2$. The collector-emitter voltage $V_{CE}$ when the gate voltage $I_R \times R_2$ is above the sum of a predetermined threshold voltage $V_{TH}$ with which the MOS transistor $Q_M$ turns on and the forward voltage $V_F$ of the diode $D_1$ is herein defined as a threshold voltage $V_{CET}$. When the collector-emitter voltage $V_{CE}$ rises above the threshold voltage $V_{CET}$, the MOS transistor $Q_M$ turns on to cause the current $I_L$ to flow. As a result, the voltage at the output point OUT in the switching unit SU, that is, the gate voltage $V_G$ of the IGBT device $Q_O$ has the same value as that of a restricted gate voltage $V_{GL}$ given in accordance with the following equation (2):

$$V_{GL} = I_L \times (R_L + r_{DS}) + V_F \quad (2)$$

where $r_{DS}$ is a drain-source resistance in the ON condition of the MOS transistor $Q_M$. The peak current value of the collector current $I_C$ which flows when the collector-emitter voltage $V_{CE}$ reaches the threshold voltage $V_{CET}$ to start a restriction operation must be so small that latch-up may not be instantaneously caused in the IGBT device $Q_O$. Specifically, a constant of each element must be set so that the collector-emitter voltage $V_{CE}$ reaches a threshold voltage $V_{CET}$ and the MOS transistor $Q_M$ turns on before time $t_6$ when the peak current $I_{CPS}$ in the case of the short-circuit of the load flows and as early as possible after time $t_4$. With such a setting, it is possible to prevent latch-up in the IGBT device $Q_O$ due to the peak current $I_{CPS}$ in the case of the short-circuit of the load.

However, when the threshold voltage $V_{CET}$ is set excessively low so as to put forward the timing of starting the protection operation, the timing of starting the normal drive operation may be delayed or the protection operation may be erroneously started due to noise or the like. Accordingly, the threshold voltage $V_{CET}$ must be set at a level where both the normal and protection operations can be smoothly performed. Setting of the timing of turning the MOS transistor $Q_M$ to the on condition will be further explained later.

Referring to FIG. 6, since the constant of each element of the equation (2) is so set that the restricted gate voltage $V_{GL}$ has a value sufficiently low, the collector current $I_C$ at the protection operation is restricted to a sufficiently small current value $I_{CL}$ even if a significantly large supply voltage $V_{CC}$ is applied as a collector-emitter voltage $V_{CE}$ in the stationary state after time $t_6$. A period from the beginning of flow of an excess current to an occurance of latch-up due to a generated heat can be extended to be approximately 50 μsec by making the current value $I_{CL}$ approximately twice as large as the rated current flowing in the normal operation. In this way, the control system SY performs the above-mentioned protection operation effectively, and latch-up due to a generated heat can be prevented.

Now, setting of a constant of each element of the diodes $D_2$ and $D_Z$ and the resistances $R_1$ and $R_2$ for reducing a reactive current will be described.

The Zener diode $D_Z$ is provided as means for dropping voltage. With the Zener diode $D_Z$, voltage across the resistances $R_1$ and $R_2$ is sufficiently smaller than the collector-emitter voltage $V_{CE}$ and, therefore, the current $I_R$ is also sufficiently small even if the supply voltage $V_{CC}$ is applied as the collector-emitter voltage $V_{CE}$ of the IGBT device $Q_O$ in the case of short-circuiting of the load or at the time of the OFF condition of the IGBT device $Q_O$. Further, while the load is not short-circuited and the IGBT device $Q_O$ is in the normal ON condition, the current $I_R$ is blocked by the Zener diode $D_Z$ and hence does not flow in the resistances $R_1$ and $R_2$ because the collector-emitter voltage $V_{CE}$ becomes a very small saturation voltage $V_{CES}$ as shown in FIG. 5.

As has been described, reactive current in the resistances $R_1$ and $R_2$ can be decreased and a power consumption can also be reduced by providing the Zener diode $D_Z$ as a voltage dropping means.

Without the Zener diode $D_Z$, sufficiently large resistance value of the resistances $R_1$ and $R_2$ can make a power consumption in these resistances small. However, in the integration of the drive circuit shown in FIG. 3, it is difficult to form a high resistance on a semiconductor substrate with high accuracy, and also a comparatively large packaging area is required. As previously mentioned, the gate voltage of the MOS transistor $Q_M$ depends upon a resistance value of the resistnaces $R_1$ and $R_2$. When the resistances value of the resistances $R_1$ and $R_2$ varies widely, the timing where the gate voltage $V_G$ reaches a threshold voltage $V_{TH}$, that is, the timing of starting the protection operation also varies widely. As a result, a drive circuit which does not start an expected protection operation may be manufactured as a finished product.

Considering the situation described above, it is preferable to use the resistances $R_1$ and $R_2$ of relatively small resistance value which have a small packaging area and can be formed with high accuracy, by employing the Zener diode $D_Z$ having a Zener voltage $V_Z$ according to the value of the supply voltage $V_{CC}$ or connecting a plurality of Zener diodes in series so as to make the voltage drop in this part of the circuit sufficiently large.

Now, setting of the timing of turning the MOS transistor $Q_M$ to the ON consition will be described.

The threshold voltage $V_{TH}$ of the MOS transistor $Q_M$ can be arbitrarily set by controlling the concentration of impurity ions injected into a channel region in the manufacturing processes, for example. Thus, the threshold voltage $V_{CET}$ with which the protection function becomes available can be set more freely.

It is desirable that a transient period necessary for turning the MOS transistor $Q_M$ from its OFF condition to the ON condition, that is, a period from the application of the threshold voltage $V_{TH}$ to the gate of the MOS transistor $Q_M$ to the completion of turning on of the MOS transistor $Q_M$ is short so as to prevent latch-up due to the peak current $I_{CPS}$ in the case of the short-circuit of the load.

However, when the transient time is too short, the MOS transistor $Q_M$ may erroneously turn on in response to the normal peak current $I_{CPN}$ as explained below. That is, as shown in FIG. 5, during the period from time $t_3$ to time $t_4$ when the normal peak current $I_{CPN}$ flows, the collector-emitter voltage $V_{CE}$ has not yet sufficiently gone down and hence there is a high possibility that the diode $D_2$ and the Zener diode $D_Z$ are in the ON condition. Hence, there is also a possibility that a part of the reverse recovery current flows as a part of the current $I_R$ and the gate voltage of the MOS transistor $Q_M$ temporarily goes up, so that the MOS transistor $Q_M$ might erroneously turn on.

The threshold voltage $V_{TH}$ is set at such a level that the erroneous operation can not be caused. Meanwhile, such erroneous operation can be avoided assuredly by selecting the construction of the MOS transistor $Q_M$ as described below.

Figure 9A:
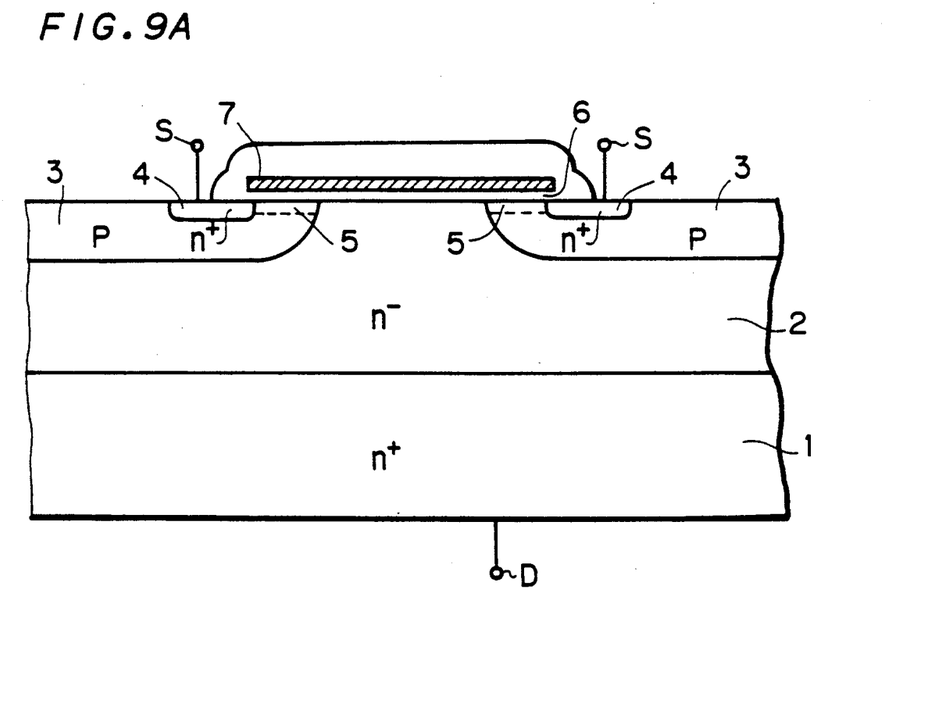
FIG. 9A is a sectional view of a VDMOS transistor.

FIG. 9A is a sectional view showing an example of a construction of a MOS transistor. A MOS transistor which has a vertical double diffused structure (VDMOS) shown in FIG. 9A is applied as the MOS transistor $Q_M$. A VDMOS transistor has a character of high voltage proof and large current capacity. Further it has a structure which has larger capacity of a gate electrode than the other structures have as described below.

In FIG. 9A an $n^-$ type diffused region 2 which is connected to a drain electrode D is formed on an $n^+$ type diffused region 1. The regions 1, 2 function as a drain. A p type diffused region 3 is formed in the $n^-$ type diffused region 2 and an $n^+$ type diffused region 4 which functions as a source and is connected to a source electrode S is formed in the p type diffused region 3. In the surface of the p type diffused region 3 between the $n^+$ type diffused region 4 and the $n^-$ type diffused region 2 a channel region 5 is formed. Above the channel region 5 and the $n^-$ type diffused region between a channel region 5 and another one a gate electrode 7 is formed on a gate oxided film 6.

Figure 9B:
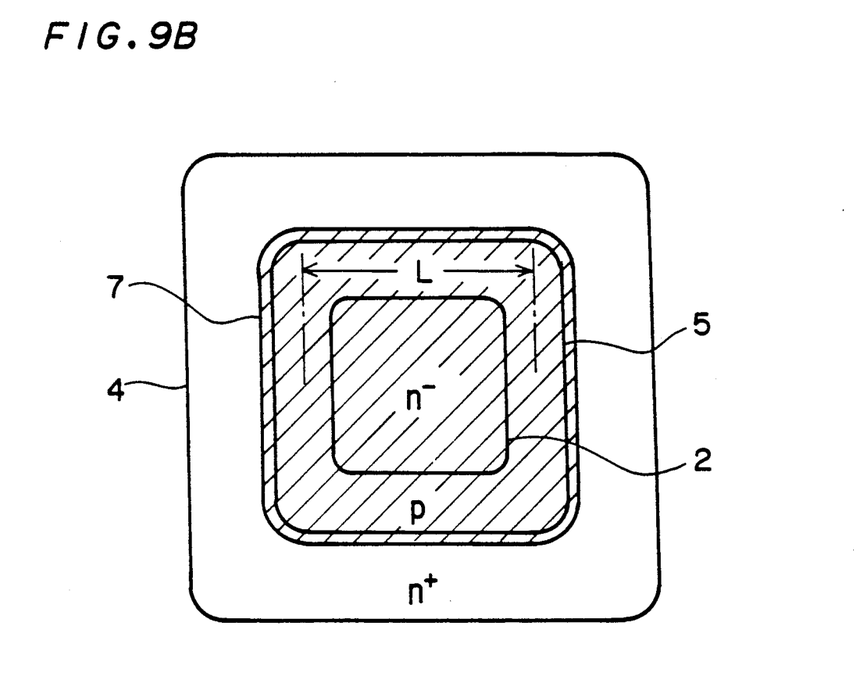
FIG. 9B is a plain view of the VDMOS transistor shown in FIG. 9A.

FIG. 9B is a diagram showing a plain structure of a unit cell of the VDMOS transistor shown in FIG. 9A. As shown in FIG. 9B the channel region 5 has a plain structure of a rectangle each side of which is L in length and the size of the gate electrode 7 is decided in accordance with the length L.

Preferably, a MOS transistor having a large length L at the side of channel region 5 and a small resistance $r_{DS}$ between drain and source in conductive state, that is, having a large current capacity and the gate electrode 7 whose capacity is large is selected as the MOS transistor $Q_M$. With such a MOS transistor $Q_M$, a drive circuit can be obtained in which needless protection operation can be avoided because the gate voltage does not remarkably go up with regard to the instantaneous peak current $I_{CPN}$ and the gate voltage sufficiently goes up with regard to the peak current $I_{CPS}$ in the case of the short-circuit of the load where an excess current continues to flow for more than a certain time so that necessary protection operation can be started.

The capacity of the gate electrode 7 can be increased by forming many unit cells shown in FIG. 9B and connecting them in a parallel manner. Further, it can be increased by decreasing the thickness of the gate oxided film 6 or adjusting the thickness of the oxided film on the gate electrode 7 or junction capacity of pn junction. The gate capacity can be controlled in a similar manner with respect to other structures, i.e., comb type or hexagon type VDMOS transistor.

For example, a required period of time from time $t_1$ shown in FIG. 7 to time $t_6$ when the peak current $I_{CPS}$ flows is approximately 2–3 μsec. Further, a required period of time from time $t_1$ shown in FIG. 5 to the time when the normal peak current $I_{CPN}$ flows is approximately 0.1 μsec in an IGBT device for a high frequency and approximately 0.8–1.0 μsec in an IGBT device for a low frequency. Under the condition of such numerical values, the MOS transistor $Q_M$ can be turned on quite well without erroneous operation after the time when the normal peak current $I_{CPN}$ flows and until the time when the peak current $I_{CPS}$ in the case of the short-circuit of the load flows to prevent latch-up due to the peak current $I_{CPS}$, by selecting the construction of the MOS transistor $Q_M$, mainly controlling the gate capacity although the selection depends on whether the switching unit SU and load LD is for a high frequency or for a low frequency. That is, the MOS transistor having a small gate capacity is used when the IGBT device is for a high frequency and the MOS transistor having a large gate capacity is used when the IGBT device is for a low frequency.

Thus, by inhibiting an excess collector current $I_C$ flowing in the IGBT device $Q_O$ in the case of the short-circuit of the load, the latch-up due to instantaneous voltage rise and generated heat can be prevented, while avoiding erroneous operation, whereby the IGBT device $Q_O$ can be protected from an excess current.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A drive circuit for driving an insulated gate bipolar transistor disposed in a load current path in series with a load to selectively supply a load current to said load in response to ON/OFF switching of said insulated gate bipolar transistor, comprising:
   a forward gate bias power source for applying a forward gate bias voltage to a gate of said insulated gate bipolar transistor to drive said insulated gate bipolar transistor;
   a voltage lowering means connected to a collector of said insulated gate bipolar transistor, for lowering a voltage of the collector by a predetermined potential;
   a voltage divider connected between said voltage lowering means and an emitter of said insulated gate bipolar transistor, which has an intermediate point for providing a divided voltage;
   a current path disposed between the gate of said insulated gate bipolar transistor and a terminal having a predetermined voltage;
   a MOS transistor having a gate connected with said intermediate point of said divider and a source and drain serially disposed in said current path;
   an output resistor connected between the gate of said insulated gate bipolar transistor and said forward gate bias power source;
   a reverse gate bias power source for applying a reverse gate bias voltage to the gate of said insulated gate bipolar transistor to make said insulated gate bipolar transistor nonconductive; and
   a control system for detecting said load current flowing in said load to activate said reverse gate bias power source to apply said reverse gate bias voltage to the gate of said insulated gate bipolar transistor with a delay time when said load current exceeds a predetermined level.

2. A drive circuit in accordance with claim 1, wherein said voltage lowering means includes a zener diode.

3. A drive circuit in accordance with claim 1, wherein said voltage divider includes a first resistor connected between said voltage lowering means and said intermediate point and a second resistor connected between said intermediate point and the emitter of said insulated gate bipolar transistor.

4. A drive circuit in accordance with claim 1, further comprising a resistor interposed in said current path for limiting a current flowing in said current path.

5. A drive circuit in accordance with claim 1, wherein said terminal having a predetermined voltage is at ground.

6. A drive circuit for driving an insulated gate bipolar transistor disposed in a load current path in series with a load to selectively supply a load current to said load in response to ON/OFF switching of said insulated gate bipolar transistor, comprising:
   a forward gate bias power source for applying a forward gate bias voltage to a gate of said insulated gate bipolar transistor to drive said insulated gate bipolar transistor;
   a voltage lowering means connected to a collector of said insulated gate bipolar transistor, for lowering a voltage of the collector by a predetermined potential;
   a voltage divider connected between said voltage lowering means and an emitter of said insulated gate bipolar transistor, which has an intermediate point for providing a divided voltage;
   a current path disposed between the gate of said insulated gate bipolar transistor and a terminal having a predetermined voltage;
   a MOS transistor having a gate connected with said intermediate point of said divider and a source and drain serially disposed in said current path;
   an output resistor connected between the gate of said insulated gate bipolar transistor and said forward gate bias power source; and
   a diode having an anode connected to the source of said MOS transistor and a cathode connected to said terminal having the predetermined voltage.

7. A drive circuit in accordance with claim 6, wherein said voltage divider includes a first resistor connected between said voltage lowering means and said intermediate point and a second resistor connected between said intermediate point and the emitter of said insulated gate bipolar transistor.

8. A drive circuit in accordance with claim 6, further comprising a resistor interposed in said current path for limiting a current flowing in said current path.

9. A drive circuit in accordance with claim 6, wherein said terminal having a predetermined voltage is at ground.

10. A drive circuit for driving an insulated gate bipolar transistor disposed in a load current path in series with a load to selectively supply a load current to said load in response to ON/OFF switching of said insulated gate bipolar transistor, comprising:
    a forward gate bias power source for applying a forward gate bias voltage to a gate of said insulated gate bipolar transistor to drive said insulated gate bipolar transistor;
    a voltage lowering means connected to a collector of said insulated gate bipolar transistor, for lowering a voltage of the collector by a predetermined potential;
    a voltage divider connected between said voltage lowering means and an emitter of said insulated gate bipolar transistor, which has an intermediate point for providing a divided voltage;
    a current path disposed between the gate of said insulated gate bipolar transistor and a terminal having a predetermined voltage;
    a MOS transistor having a gate connected with said intermediate point of said divider and a source and drain serially disposed in said current path;
    an output resistor connected between the gate of said insulated gate bipolar transistor and said forward gate bias power source; and
    a switching element which is connected between said forward gate bias power source and the gate of said insulated gate bipolar transistor and switched on and off so as to switch said insulated gate bipolar transistor at a predetermined frequency, wherein said MOS transistor has a relatively small gate capacity when said predetermined frequency is relatively large and a relatively large gate capacity when said predetermined frequency is relatively small.

11. A drive circuit in accordance with claim 10, wherein said voltage divider includes a first resistor connected between said voltage lowering means and said intermediate point and a second resistor connected between said intermediate point and the emitter of said insulated gate bipolar transistor.

12. A drive circuit in accordance with claim 10, further comprising a resistor interposed in said current path for limiting a current flowing in said current path.

13. A drive circuit in accordance with claim 10, wherein said terminal having a predetermined voltage is at ground.

* * * * *